(12) United States Patent
Hou et al.

(10) Patent No.: US 10,901,629 B2
(45) Date of Patent: Jan. 26, 2021

(54) METHOD AND APPARATUS FOR MANAGING HEALTH OF A STORAGE MEDIUM IN A STORAGE DEVICE

(71) Applicant: Huawei Technologies Co., Ltd., Shenzhen (CN)

(72) Inventors: Jiancen Hou, Chengdu (CN); Kun Tang, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/431,177

(22) Filed: Jun. 4, 2019

(65) Prior Publication Data

US 2019/0286341 A1  Sep. 19, 2019

Related U.S. Application Data

(63) Continuation of application No. PCT/CN2017/114237, filed on Dec. 1, 2017.

(30) Foreign Application Priority Data

Dec. 6, 2016 (CN) .......................... 2016 1 1110236

(51) Int. Cl.
*G06F 12/00* (2006.01)
*G06F 3/06* (2006.01)
(Continued)

(52) U.S. Cl.
CPC .............. *G06F 3/0617* (2013.01); *G06F 3/06* (2013.01); *G06F 3/064* (2013.01); *G06F 3/0673* (2013.01);
(Continued)

(58) Field of Classification Search
CPC .......... G06F 3/0617; G06F 3/06; G06F 12/12; G06F 3/064; G06F 3/0673;
(Continued)

(56) References Cited

U.S. PATENT DOCUMENTS

| | | |
|---|---|---|
| 8,484,522 B2 | 7/2013 | Flynn et al. |
| 2004/0196707 A1 | 10/2004 | Yoon et al. |

(Continued)

FOREIGN PATENT DOCUMENTS

| | | |
|---|---|---|
| CN | 101425334 A | 5/2009 |
| CN | 101872326 A | 10/2009 |

(Continued)

*Primary Examiner* — Mardochee Chery
(74) *Attorney, Agent, or Firm* — Slater Matsil, LLP

(57) ABSTRACT

A method for managing a storage medium in a storage device is provided. The method includes detecting whether there is a problematic storage block in a data storage area of the storage medium, wherein the problematic storage block is a storage block whose health degree is less than a preset value, wherein the health degree is used to measure performance of a storage block in the storage medium and is in direct proportion to the performance of the storage block; and replacing the problematic storage block with a replacement storage block in a replacement area of the storage medium when the problematic storage block is detected, wherein a health degree of a storage block in the data storage area is greater than a health degree of a storage block in the replacement area.

16 Claims, 7 Drawing Sheets

(51) Int. Cl.
  *G06F 12/02* (2006.01)
  *G06K 9/62* (2006.01)
  *G06F 12/12* (2016.01)
(52) U.S. Cl.
  CPC .......... *G06F 12/0246* (2013.01); *G06F 12/12* (2013.01); *G06K 9/6267* (2013.01)
(58) Field of Classification Search
  CPC ......... G06F 12/0246; G06F 2212/7211; G06F 2212/1036; G06F 2212/1016; G06F 2212/7204; G06F 3/0616; G06F 3/0679; G06K 9/6267; G06K 9/6265; G11C 29/765; G11C 29/52
  USPC ........................................................ 711/114
  See application file for complete search history.

(56) References Cited

U.S. PATENT DOCUMENTS

2010/0235605 A1* 9/2010 Perry .................. G06F 12/0246
                                                                711/170
2011/0078364 A1   3/2011 Lee et al.

FOREIGN PATENT DOCUMENTS

| CN | 102135942 A | 7/2011 |
| CN | 102622306 A | 8/2012 |
| CN | 103455386 A | 12/2013 |
| CN | 104166627 A | 11/2014 |
| CN | 104615550 A | 5/2015 |
| WO | 2009124320 A1 | 10/2009 |

\* cited by examiner

METHOD AND APPARATUS FOR MANAGING HEALTH OF A STORAGE MEDIUM IN A STORAGE DEVICE

CROSS-REFERENCE TO RELATED APPLICATIONS

This application is a continuation of International Application No. PCT/CN2017/114237, filed on Dec. 1, 2017, which claims priority to Chinese Patent Application No. 201611110236.6, filed on Dec. 6, 2016. The disclosures of the aforementioned applications are hereby incorporated herein by reference in their entireties.

TECHNICAL FIELD

This application relates to the field of storage technologies, and more specifically, to a method and an apparatus for managing a storage medium in a storage device, and a storage device.

BACKGROUND

A solid state drive (SSD) is a data storage device including a solid-state electronic storage component, and mainly includes an SSD controller, a RAM, and a flash storage unit. A storage medium commonly used by an existing SSD is a non-volatile random access storage medium. A NAND flash is designed based on a floating-gate (Floating Gate) transistor, and latches electric charges by using a floating gate.

However, when a P/E (program/erase) operation is performed on the NAND flash, an insulation layer of the floating-gate transistor is damaged to some extent, and more frequent operations lead to a higher possibility of forming a UNC bad block.

An amount of over provisioning (OP) space of the SSD is reduced as a quantity of UNC bad blocks increases. As the amount of OP area is reduced, a write amplification factor (WAF) of the SSD gradually increases, and input/output operations per second (IOPS) of the SSD is also gradually reduced. Therefore, it can be learned that as operations are performed on the NAND flash more frequently, consumption of the SSD is increasingly fast, and performance is increasingly low.

SUMMARY

Embodiments of this application provide a method and an apparatus for managing a storage medium in a storage device, and a storage device, to resolve a prior-art problem that a WAF of an SSD increases and performance deteriorates due to OP reduction during use of the SSD.

To resolve the foregoing problem, the embodiments of this application provide the following technical solutions.

A first aspect of this application discloses a method for managing a storage medium in a storage device, where the storage medium is pre-divided into a data storage area and a replacement area based on health degrees of storage blocks, a health degree of a storage block in the data storage area is greater than a health degree of a storage block in the replacement area, the health degree is used to measure performance of a storage block in the storage medium, and the health degree is in direct proportion to the performance of the storage block; and the method for managing a storage medium includes:
detecting, by the storage device, whether there is a problematic storage block in the data storage area, where the problematic storage block is a storage block whose health degree is less than a preset value; and when the problematic storage block is detected, moving the problematic storage block from the data storage area, obtaining a replacement storage block from the replacement area, and moving the obtained replacement storage block into the data storage area.

According to the method for managing a storage medium, after detecting the problematic storage block, the storage device replaces the problematic storage block with the replacement storage block in the replacement area obtained through pre-division. OP space of the storage device does not need to be reduced, thereby ensuring stability of the OP area in an entire life cycle of the storage device, and stabilizing a service life and performance of the storage device.

In a first implementation of the first aspect of this application, the replacement area includes at least two levels of replacement storage areas, the at least two levels of replacement storage areas are sorted in descending order of health degrees of replacement storage blocks included in the at least two levels of replacement storage areas, and the obtaining a replacement storage block from the replacement area includes:

obtaining the replacement storage block from a current replacement storage area; and determining whether there is still the replacement storage block in the current replacement storage area, and if there is no replacement storage block, using a next-level replacement storage area of the current replacement storage area as the current replacement storage area.

According to the method for managing a storage medium, in a process of obtaining the replacement storage block, the storage device obtains the replacement storage block from the current replacement storage area if there is the replacement storage block in the current replacement storage area, and determines, after obtaining the replacement storage block, whether there is still the replacement storage block in the current replacement storage area. If there is no replacement storage block in the current replacement storage area, the next-level replacement storage area is used as the current replacement storage area. In this way, when replacement is further required subsequently, a replacement storage block can be directly obtained from a replacement storage area marked as the current replacement storage area. According to this method, the replacement storage block can be quickly obtained for replacement.

In a second implementation provided based on the first implementation of the first aspect of this application, the preset value is a threshold corresponding to the current replacement storage area, and when the problematic storage block is detected, the problematic storage block is moved from the data storage area into the next-level replacement storage area of the current replacement storage area.

According to the method for managing a storage medium, the preset value is the threshold corresponding to the current replacement storage area, and the storage device moves the problematic storage block whose health degree is less than the preset value into the next-level replacement storage area of the current replacement storage area. With reference to the first implementation, the replacement storage block is obtained from the current replacement storage area and is moved into the data storage area, thereby ensuring that a normal storage block is moved into the data storage area.

In a third implementation of the first aspect of this application, the storage medium further includes an invalid area, the invalid area includes an invalid storage block, the preset value is a threshold corresponding to the invalid area, and when the problematic storage block is detected, the problematic storage block is moved from the data storage area into the invalid area.

According to the method for managing a storage medium, the storage device includes the invalid area, and the preset value is the threshold corresponding to the invalid area. Therefore, the storage device can directly move the problematic storage block whose health degree is less than the preset value into the invalid area.

In a fourth implementation of the first aspect of this application, the method further includes: obtaining at least one performance parameter of each storage block in the storage medium in the storage device;

obtaining a health degree score of each storage block in the storage medium based on the at least one performance parameter;

sorting the storage blocks in the storage medium in descending order of the health degree scores;

selecting first m storage blocks as a data storage area based on a sorting sequence of all the storage blocks, where m=(Capacityuser+Capacityop)/Sizeblock, where Capacityop is a size of OP area of the storage device, Capacityuser is a size of a user-visible storage area of the storage device, and Sizeblock is a size of the storage block; and obtaining the replacement area from remaining storage blocks in the storage medium through classification.

According to the method for managing a storage medium, during production of the storage device, the storage medium is pre-divided based on the health degree score that is of each storage block in the storage medium and that is determined based on the at least one performance parameter of each storage block, to obtain the data storage area and the replacement area, so that the replacement storage block can be obtained from the replacement area when the problematic storage block subsequently occurs in the data storage area. This ensures a size of the data storage area and stabilizes a service life and performance of the storage device without reducing the OP area of the storage device.

In a fifth implementation provided based on the fourth implementation of the first aspect of this application, the obtaining a health degree score of each storage block in the storage medium based on the at least one performance parameter includes:

obtaining statistics data corresponding to 1 health degree statistics indicators of each storage block, where a value of 1 is greater than 1;

calculating i pieces of statistics data to obtain health degree scores $Score_i$ of the i health degree statistics indicators;

determining weights $W_i$ of the i health degree statistics indicators in an overall fuzzy evaluation system, where $0<W_i\leq 1$, and $\Sigma W_i=1$; and obtaining the health degree score $Score=\Sigma(Score_i*W_i)$ of the storage block by using the i health degree scores $Score_i$ and the weights $W_i$.

In a sixth implementation provided based on the fifth implementation of the first aspect of this application, the calculating i pieces of statistics data to obtain health degree scores $Score_i$ of the i health degree statistics indicators includes:

obtaining the health degree scores $Score_i$ of the i health degree statistics indicators by using a zero-mean normalization algorithm: $Score_i=fi(x)=(x-u)/theta$, where x is a statistics value of the health degree statistics indicators, u is a sample average of the health degree statistics indicators, theta is a sample variance of the health degree statistics indicators, and the sample average and the sample variance are common statistics; or obtaining the health degree scores $Score_i$ of the i health degree statistics indicators by using a linear normalization algorithm: $Score_i=fi(x)=(x-xmin)/(xmax-xmin)$, where x is a statistics value of the health degree statistics indicators, xmax is a maximum sample value of the health degree statistics indicators or a maximum value defined according to experience, and xmin is a minimum sample value of the health degree statistics indicators or a minimum value defined according to experience.

In a seventh implementation of the first aspect of this application, the storage device includes an index table, and the index table is used to record information about a storage block included in each partition of the storage medium.

According to the method for managing a storage medium, the storage device can rapidly query each partition in the storage medium by using the index table.

A second aspect of this application provides an apparatus for managing a storage medium in a storage device, where the storage medium is pre-divided into a data storage area and a replacement area based on health degrees of storage blocks, a health degree of a storage block in the data storage area is greater than a health degree of a storage block in the replacement area, and the health degree is used to measure performance of a storage block in the storage medium; and the apparatus for managing a storage medium includes:

a detection module, configured to detect whether there is a problematic storage block in the data storage area, where the problematic storage block is a storage block whose health degree is less than a preset value; and a replacement module, configured to: when the problematic storage block is detected, move the problematic storage block from the data storage area, obtain a replacement storage block from the replacement area, and move the obtained replacement storage block into the data storage area.

According to the apparatus for managing a storage medium, after the detection module detects the problematic storage block, the replacement module replaces the problematic storage block with the replacement storage block in the replacement area obtained through pre-division. OP area of the storage device does not need to be reduced, thereby ensuring stability of the OP area in an entire life cycle of the storage device, and stabilizing a service life and performance of the storage device.

In a first implementation of the second aspect of this application, the replacement area includes at least two levels of replacement storage areas, the at least two levels of replacement storage areas are sorted in descending order of health degrees of replacement storage blocks included in the at least two levels of replacement storage areas, and when obtaining the replacement storage block from the replacement area, the replacement module includes:

a first obtaining unit, configured to obtain the replacement storage block from a current replacement storage area; and a marking unit, configured to: determine whether there is still the storage block in the current replacement storage area, and if there is no storage block in the current replacement storage area, use a next-level replacement storage area of the current replacement storage area as the current replacement storage area.

According to the apparatus for managing a storage medium, the first obtaining unit obtains the replacement storage block from the current replacement storage area, and the marking unit determines whether the current replacement storage area still includes the storage block. If there is no replacement storage block in the current replacement storage area, the next-level replacement storage area is used as the current replacement storage area. In this way, when replacement is further required subsequently, a replacement storage block can be directly obtained from a replacement storage area marked as the current replacement storage area. In this way, the replacement storage block can be rapidly obtained for subsequent replacement.

In a second implementation provided based on the first implementation of the second aspect of this application, the preset value is a threshold corresponding to the current replacement storage area, and when the problematic storage block is moved from the data storage area, the replacement module further includes:

a first moving unit, configured to move the problematic storage block from the data storage area into the next-level replacement storage area of the current replacement storage area.

According to the apparatus for managing a storage medium, the preset value is the threshold corresponding to the current replacement storage area, and the storage device moves the problematic storage block whose health degree is less than the preset value into the next-level replacement storage area of the current replacement storage area. With reference to the first implementation, the replacement storage block is obtained from the current replacement storage area and is moved into the data storage area, thereby ensuring that a normal storage block is moved into the data storage area.

In a third implementation of the second aspect of this application, the storage medium further includes an invalid area, the invalid area includes an invalid storage block, the preset value is a threshold corresponding to the invalid area, and correspondingly, the replacement module that moves the problematic storage block from the data storage area when the problematic storage block is detected includes:

a first moving unit, configured to move the problematic storage block from the data storage area into the invalid area when the problematic storage block is detected.

According to the apparatus for managing a storage medium, when the preset value is the threshold corresponding to the invalid area, the first moving unit directly moves the problematic storage block whose health degree is less than the preset value into the invalid area.

In a fourth implementation of the first aspect of this application, the apparatus further includes:

a classification module, configured to: obtain at least one performance parameter of each storage block in the storage medium in the storage device; obtain a health degree score of each storage block in the storage medium based on the at least one performance parameter; sort the storage blocks in the storage medium in descending order of the health degree scores; select first m storage blocks as a data storage area based on a sorting sequence of all the storage blocks, where m=(Capacityuser+Capacityop)/Sizeblock, where Capacityop is a size of OP area of the storage device, Capacityuser is a size of a user-visible storage area of the storage device, and Sizeblock is a size of the storage block; and use remaining storage blocks as the replacement area.

According to the apparatus for managing a storage medium, during production of the storage device, the apparatus for managing a storage medium pre-divides the storage medium based on the health degree score that is of each storage block in the storage medium and that is determined based on the at least one performance parameter of each storage block, to obtain the data storage area and the replacement area, so that the replacement storage block can be obtained from the replacement area when the problematic storage block subsequently occurs in the data storage area. This ensures a size of the data storage area and stabilizes a service life and performance of the storage device without reducing the OP of the storage device.

In a fifth implementation provided based on the fourth implementation of the second aspect of this application, the calculation module includes:

a third obtaining unit, configured to obtain statistics data corresponding to i health degree statistics indicators of each storage block, where a value of i is greater than 1;

a first calculation unit, configured to calculate i pieces of statistics data to obtain health degree scores $Score_i$ of the i health degree statistics indicators;

a second calculation unit, configured to determine weights $W_i$ of the i health degree statistics indicators in an overall fuzzy evaluation system, where $0<W_i \leq 1$, and $\Sigma W_i=1$; and a third calculation unit, configured to obtain the health degree score $Score=\Sigma(Score_i*W_i)$ of the storage block by using the i health degree scores $Score_i$ and the weights $W_i$.

In a sixth implementation provided based on the fifth implementation of the second aspect of this application, the first calculation unit includes:

a zero-mean normalization calculation unit, configured to obtain the health degree scores $Score_i$ of the i health degree statistics indicators by using a zero-mean normalization algorithm: $Score_i=fi(x)=(x-u)/theta$, where x is a statistics value of the health degree statistics indicators, u is a sample average of the health degree statistics indicators, theta is a sample variance of the health degree statistics indicators, and the sample average and the sample variance are common statistics; or a linear normalization calculation unit, configured to obtain the health degree scores $Score_i$ of the i health degree statistics indicators by using a linear normalization algorithm: $Score_i=fi(x)=(x-xmin)/(xmax-xmin)$, where x is a statistics value of the health degree statistics indicators, xmax is a maximum sample value of the health degree statistics indicators or a maximum value defined according to experience, and xmin is a minimum sample value of the health degree statistics indicators or a minimum value defined according to experience.

In a seventh implementation of the second aspect of this application, the apparatus for managing a storage medium includes an index table, and the index table is used to record information about a storage block included in each partition of the storage medium.

A third aspect of this application provides a storage device, including a storage medium, a memory, and a processor that communicates with the memory, where the storage medium is pre-divided into a data storage area and a replacement area based on health degrees of storage blocks, a health degree of a storage block in the data storage area is greater than a health degree of a storage block in the replacement area, the health degree is used to measure performance of a storage block in the storage medium, and the health degree is in direct proportion to the performance of the storage block;

the memory is configured to store program code used for managing the storage medium; and the processor is configured to execute the program code stored in the memory to implement the method for managing a storage medium in a storage device disclosed in the first aspect of this application.

BRIEF DESCRIPTION OF THE DRAWINGS

To describe the technical solutions in the embodiments of this application more clearly, the following briefly describes the accompanying drawings required for describing the embodiments.

DETAILED DESCRIPTION OF ILLUSTRATIVE EMBODIMENTS

Figure 1:
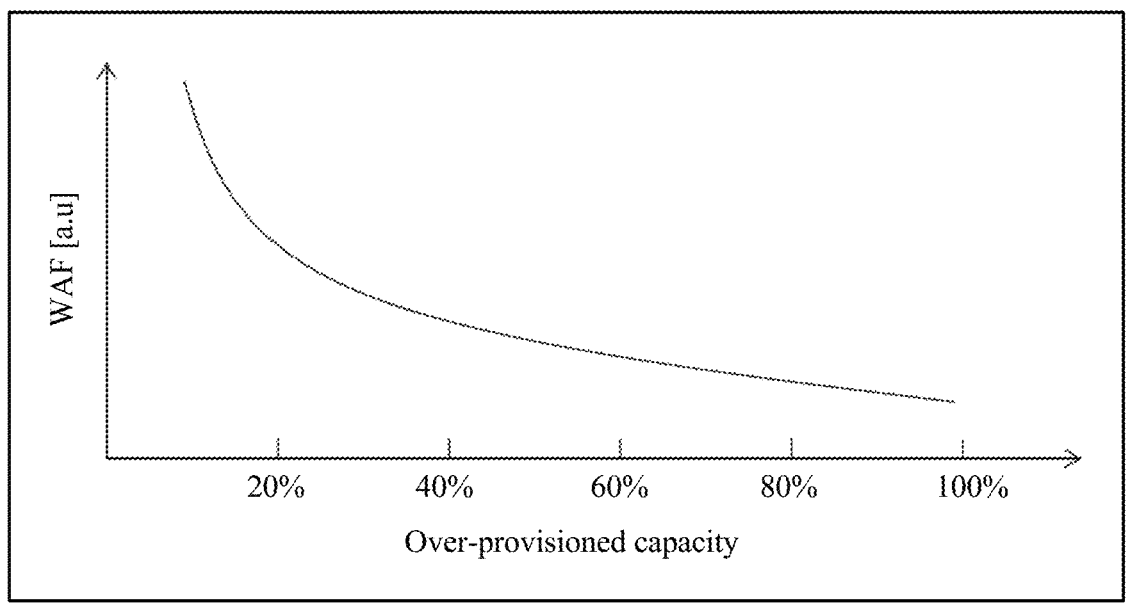
FIG. 1 is a diagram of a changing relationship between OP and a WAF according to an embodiment of this application.
Figure 2:
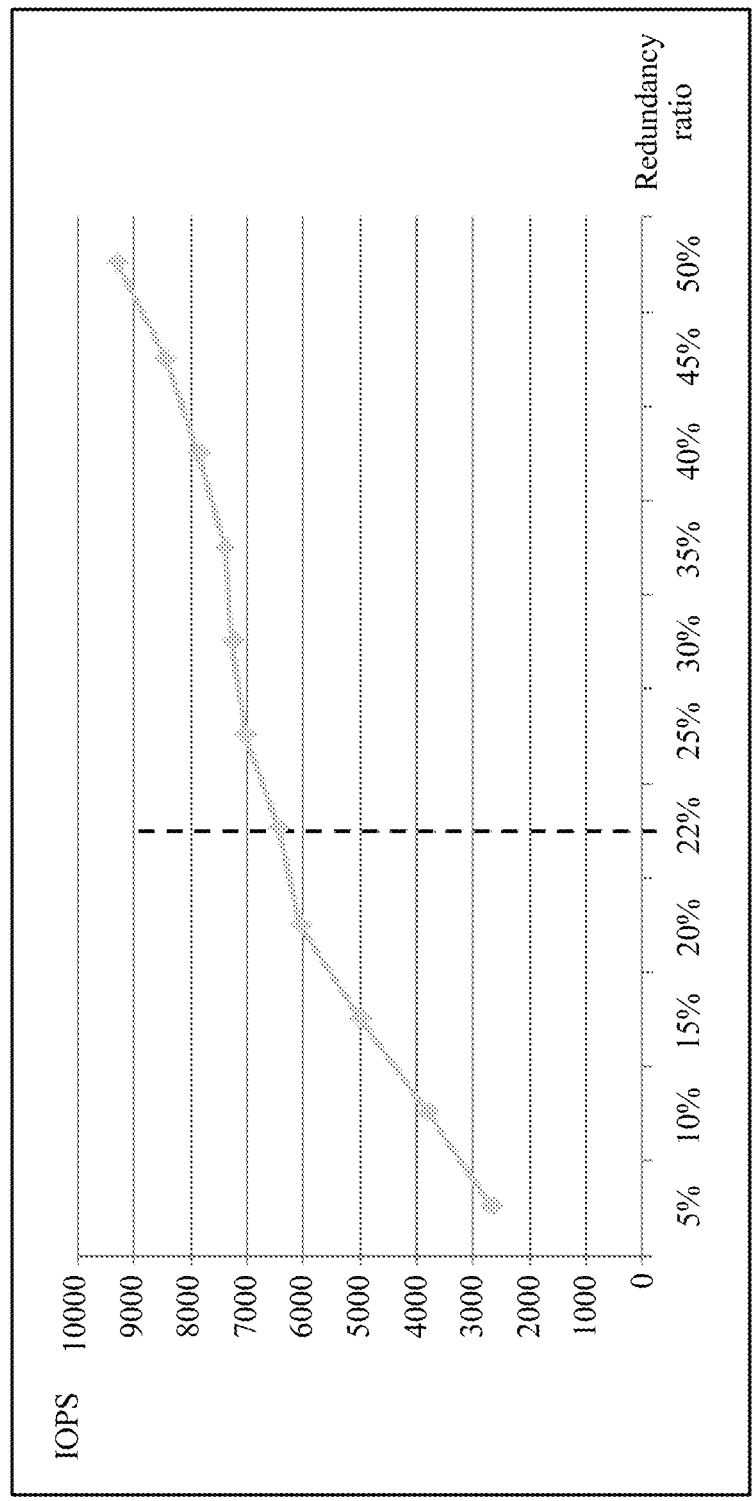
FIG. 2 is a diagram of a changing relationship between a redundancy ratio and IOPS according to an embodiment of this application.
Figure 3:
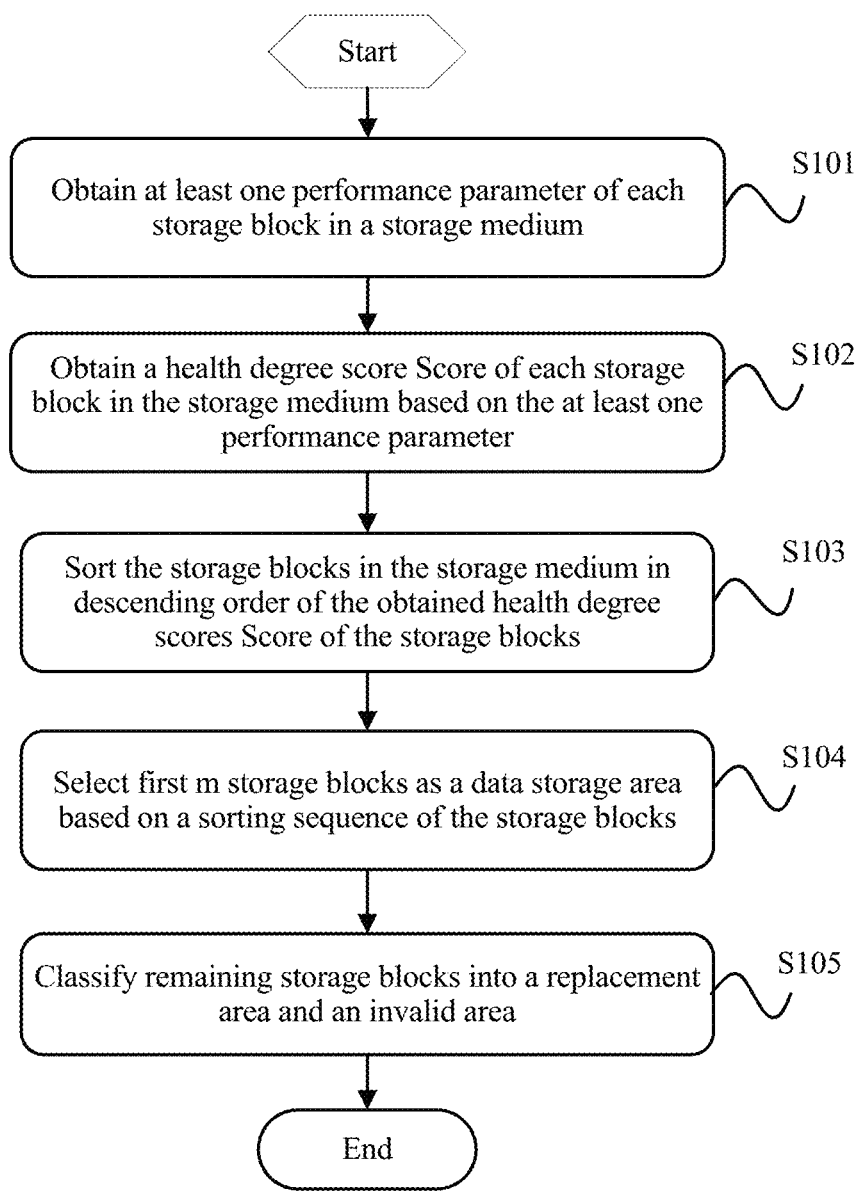
FIG. 3 is a schematic flowchart of pre-dividing a storage medium in a storage device according to an embodiment of this application.

Performance of each storage block of an SSD is tested before the SSD is delivered. A storage block that reaches a standard value in a performance test is provided for a user, and a storage block that fails to reach the standard value in a performance test is recorded as an invalid block and is not used subsequently. Consequently, during use of the SSD, an amount of OP for the SSD is reduced as generation of the invalid block in the SSD. FIG. 1 is a diagram of a changing relationship between OP and a write amplification factor (WAF), and FIG. 2 is a diagram of a changing relationship between a redundancy ratio and input/output operations per second (IOPS). It can be learned from FIG. 1 and FIG. 2 that, as an amount of OP for a storage device is reduced, a WAF of the storage device increases, and performance of the storage device deteriorates.

However, in the prior art, some invalid blocks can still be used in practice although these invalid blocks do not reach the standard value, and performance of these invalid blocks is poorer than a storage block that reaches a standard. In the embodiments of the present invention, storage blocks determined as invalid blocks in the prior art are further classified based on performance, and a storage block that can still be used is identified for further use. In the embodiments of this application, a storage medium may be divided into a data storage area, a replacement area, and an invalid area. A storage block included in the data storage area is an area that meets the standard in the prior art and that can be provided for the user to use, and includes a user-visible space and OP area. A storage block included in the replacement area is a storage block that can still be used although performance of the storage block does not meet the standard. A storage block included in the invalid area is a storage block that cannot be used, namely, a bad block.

In this way, during use of the SSD, if there is an invalid block in the data storage area provided for the user to use, the invalid block in the data storage area may be replaced with a storage block in the replacement area, thereby ensuring that a quantity of storage blocks in the OP area does not decrease, and reducing an increase in a WAF of the storage device and deterioration of performance of the storage device. A specific process is described in detail by using the following embodiments.

In the embodiments of this application, a storage medium is divided into areas based on a health degree. The health degree is used to measure performance of a storage block in the storage medium and is in direct proportion to the performance of the storage block. In addition, a replacement area may be further divided into a plurality of areas.

Figure 4:
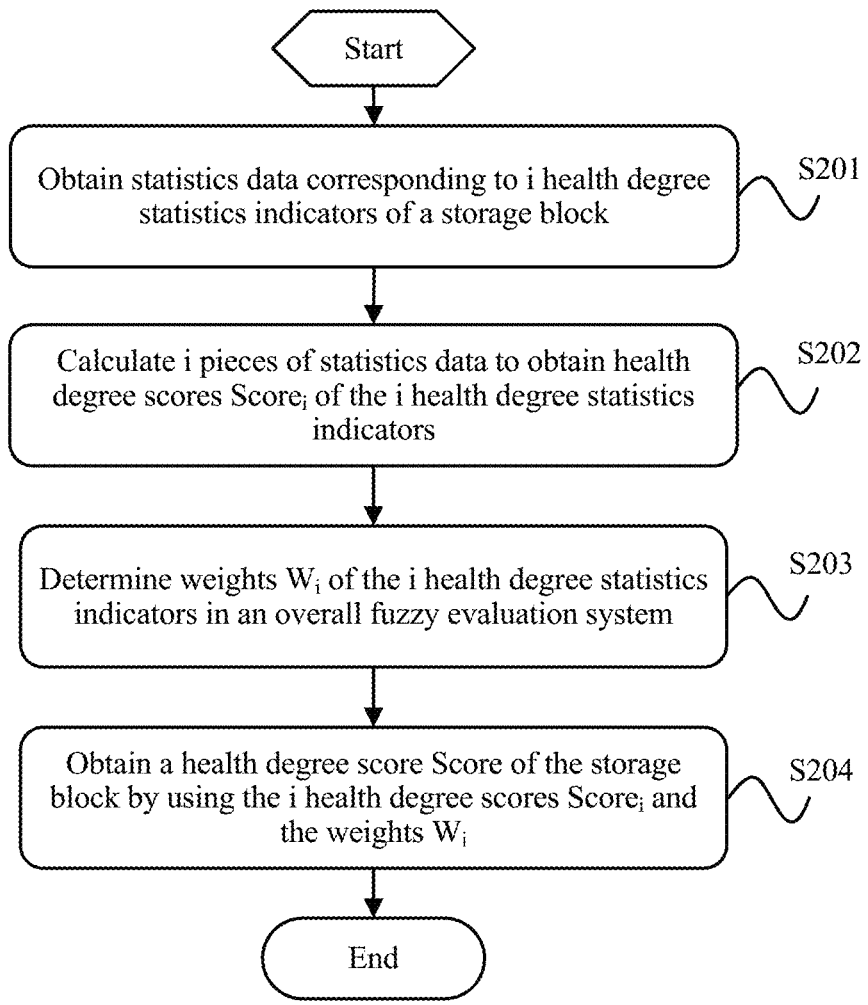
FIG. 4 is a schematic flowchart of calculating a health degree of a storage block according to an embodiment of this application.

FIG. 4 shows a method for pre-dividing a storage medium in a storage device into areas before delivery of an SSD according to an embodiment of this application. The method mainly includes the following steps.

S101. The storage device obtains at least one performance parameter of each storage block in the storage medium.

In S101, the performance parameter that is of each storage block in the storage medium and that is obtained by the storage device is a health degree statistics indicator, and a health degree statistics indicator of each storage block includes but is not limited to: an RBER, tBERS, P/E, read retry count, and ECC count.

The RBER is a raw bit error rate, and a higher RBER leads to a lower health degree of the storage medium.

The tBERS is a latency of an erase operation of the storage medium. As the P/E increases, the tBERS gradually increases.

The P/E is a quantity of times of programming/erasing the storage medium, and a larger quantity of P/E times leads to a lower health degree of the storage medium.

The read retry count is a quantity of read retry times, and a larger quantity of read retry times leads to a lower health degree of the storage medium.

The ECC count is a quantity of ECC times, and a larger quantity of ECC times leads to a lower health degree of the storage medium.

The UNC count is a quantity of UNC times, and a larger quantity of UNC times leads to a lower health degree of the storage medium.

S102. The storage device obtains a health degree score Score of each storage block in the storage medium based on the at least one performance parameter.

Figure 5:
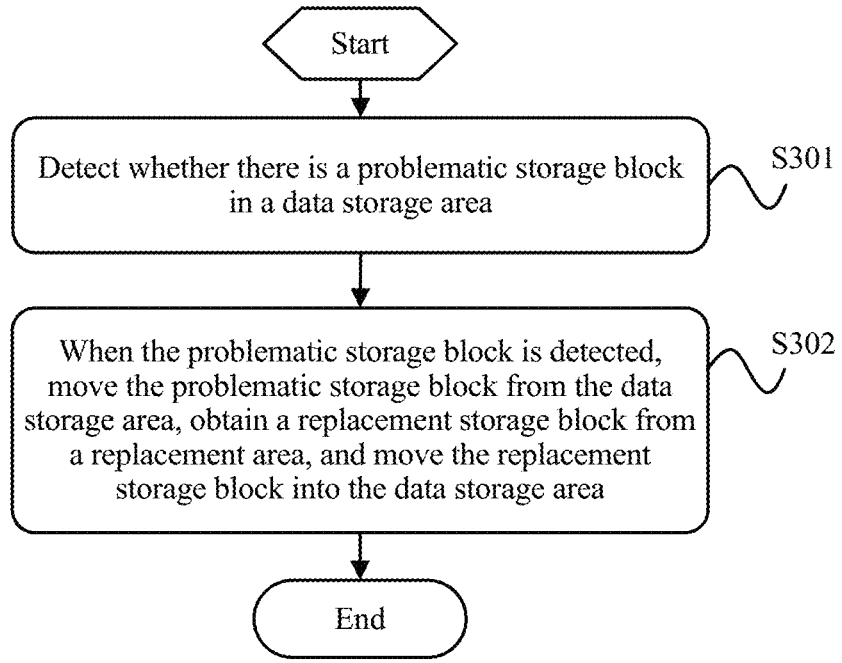
FIG. 5 is a schematic flowchart of a method for managing a storage medium in a storage device according to an embodiment of this application.

In S102, a process in which the storage device obtains the health degree score of the storage block based on the at least one performance parameter of the storage block is described by using one storage block as an example. As shown in FIG. 5, the process includes the following steps.

S201. The storage device obtains statistics data corresponding to i health degree statistics indicators of the storage block, where a value of i is greater than 1.

S202. The storage device calculates i pieces of statistics data to obtain health degree scores $Score_i$ of the i health degree statistics indicators.

In S202, the storage device may calculate the health degree scores $Score_i$ in two manners:

Manner 1: The storage device obtains the health degree scores $Score_i$ of the i health degree statistics indicators by using a zero-mean normalization algorithm shown in formula (1):

$$Score_i = fi(x) = (x-u)/\text{theta} \quad (1),\text{ where}$$

x is a statistics value of the health degree statistics indicators, u is a sample average of the health degree statistics indicators, theta is a sample variance of the health degree statistics indicators, and both the sample average and the sample variance are common statistics.

Manner 2: The storage device obtains the health degree scores $Score_i$ of the i health degree statistics indicators by using a linear normalization algorithm shown in formula (2):

$$Score_i = fi(x) = (x - x\min)/(x\max - x\min) \quad (2),\text{ where}$$

x is a statistics value of the health degree statistics indicators, xmax is a maximum sample value of the health degree statistics indicators or a maximum value defined according to experience, and xmin is a minimum sample value of the health degree statistics indicators or a minimum value defined according to experience.

S203. The storage device determines weights $W_i$ of the i health degree statistics indicators in an overall fuzzy evaluation system, where $0 < W_i \leq 1$, and $\Sigma W_i = 1$.

S204. The storage device obtains a health degree score Score of the storage block by using the i health degree scores $Score_i$ and the weights Wi based on formula (3):

$$Score = \Sigma(Score_i * W_i) \quad (3).$$

In S203, the storage device may obtain a weight of a health degree statistics indicator of each storage block in two manners.

Manner 1: The weight is obtained based on experience of technical personnel.

Experienced technical personnel subjectively evaluate a degree to which a health degree statistics indicator of a storage block affects a health degree of the storage block, and determines a weight of each health degree statistics indicator, and the storage device directly obtains the determined weight.

Manner 2: The weight is obtained by using a main component analysis method.

The storage device performs orthogonal transform on original statistics data corresponding to each health degree statistics indicator, and converts a group of variables that may be in correlation into a group of variables that are not linearly correlated, to determine a weight of each health degree statistics indicator by using these variables.

In S102, the storage device may calculate a health degree score Score of each storage block by using a process of S201 to S204. This calculation process is merely an optional calculation process disclosed in this embodiment of this application.

S103. The storage device sorts the storage blocks in the storage medium in descending order of the obtained health degree scores Score of the storage blocks.

S104. The storage device selects first m storage blocks as a data storage area based on a sorting sequence of the storage blocks.

In S104, the storage device determines a quantity m of to-be-selected storage blocks based on formula (4). The storage device starts selection from a storage block with a highest health degree based on the sorting sequence of the storage blocks, till m storage blocks are obtained, and the m storage blocks are used as the data storage area. The data storage area is at a highest health degree level.

$$m = (\text{Capacityuser} + \text{Capacityop})/\text{Sizeblock} \quad (4),\text{ where}$$

Capacityop is a size of OP area of the storage device, Capacityuser is a size of a user-visible storage area of the storage device, and Sizeblock is a size of the storage block.

S105: The storage device classifies remaining storage blocks into a replacement area and an invalid area.

The storage device may classify a storage block whose health degree score is less than or equal to a first preset value as the invalid area, and classify a storage block whose health degree score is greater than the first preset value as the replacement area.

The storage device may further classify storage blocks in the replacement area based on health degree scores of the storage blocks, to obtain a plurality of levels of replacement storage areas sorted in descending order of health degrees.

Optionally, capacity sizes of the plurality of levels of replacement storage areas obtained by the storage device through classification may be the same or different.

Optionally, the capacity sizes of the plurality of levels of replacement storage areas obtained by the storage device through classification may be the same as or may be different from an OP capacity of the storage medium.

Optionally, the storage device may also use, as the invalid area, a storage area at a lowest health degree level in the plurality of levels of replacement storage areas sorted in descending order of the health degrees.

After performing S101 to S105 in advance, the storage device obtains a plurality of levels of storage areas sorted in descending order of health degrees. A storage area with a highest health degree is used as the data storage area, an area with a lowest health degree is used as the invalid area, and an intermediate area is used as the replacement area. Alternatively, the replacement area may be further divided into a plurality of levels of replacement storage areas based on values of health degrees.

The storage device creates an index table for ease of subsequently managing partitions of the storage medium, in other words, managing the data storage area, the replacement area, and the invalid area. The index table is used to record information about a storage block included in each partition of the storage medium.

Specifically, in this embodiment of this application, the storage device uses, as tree nodes, partitions obtained through division. Storage blocks included in each partition are sorted in descending order under a corresponding tree node based on values of health degree scores, and a corresponding index table is created.

In a process of managing the partitions obtained by pre-dividing the storage medium, the storage device performs indexing based on the index table.

Figure 6:
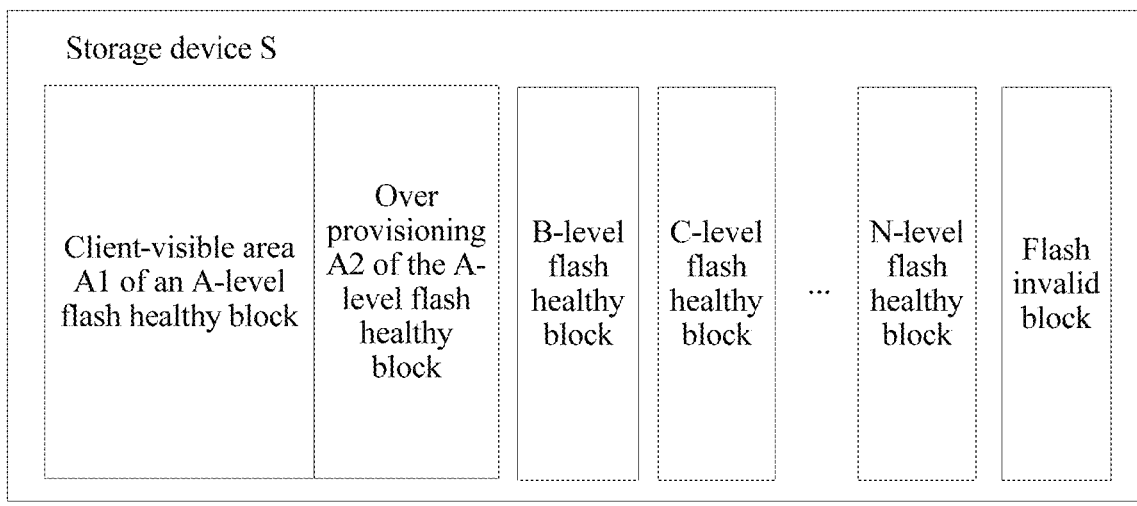
FIG. 6 is a schematic diagram of multi-level division of a storage medium in a storage device according to an embodiment of this application.

FIG. 6 is a schematic flowchart of a method for managing a storage medium in a storage device according to an embodiment of this application. The method includes the following steps.

S301. The storage device detects, in advance, whether there is a problematic storage block in a data storage area obtained through pre-division based on health degrees of storage blocks. If there is the problematic storage block, the storage device performs S302.

The problematic storage block is a storage block whose health degree is less than a preset value.

In an implementation in which a replacement area is not further divided into a plurality of replacement storage areas, the preset value is a threshold of an invalid area, and if a health degree of a storage block is less than the threshold of the invalid area, the storage block is determined as an invalid block and is placed into the invalid area.

In an implementation in which the replacement area is further divided into a plurality of replacement storage areas, the preset value is a threshold corresponding to a current replacement storage area. When the problematic storage block in the data storage area is moved, a replacement storage block is obtained from the current replacement area and placed in the data storage area. A threshold corresponding to the current replacement storage area is a health degree of a storage block with a minimum health degree in the current replacement storage area.

S302: When detecting the problematic storage block, the storage device moves the problematic storage block from the data storage area, obtains a replacement storage block from a replacement area, and moves the replacement storage block into the data storage area.

In a process in which the storage device manages a storage block in the storage medium in S301 and S302, a detected problematic storage block varies because different preset values are set, and a performed replacement manner also varies due to different partitions obtained through pre-division.

In view of this, in this embodiment of this application, the following three basic cases are provided to describe, in detail, a process in which the storage device performs S301 and S302.

Case 1:

The data storage area, the replacement area, and the invalid area are obtained through pre-division, and the preset value is set to the threshold corresponding to the invalid area.

First, the storage device detects, in the data storage area, the problematic storage block whose health degree is less than the preset value, uses the problematic storage block as an invalid storage block, and moves the problematic storage block into the invalid area.

Then, the storage device obtains a replacement storage block from the replacement area, and moves the replacement storage block into the data storage area.

Case 2:

The data storage area, the replacement area, and the invalid area are obtained through pre-division. The replacement area includes a plurality of levels of replacement storage areas. A first-level replacement storage area is first used as the current replacement area, and the preset value is set to a threshold corresponding to the first-level replacement storage area. The first-level replacement storage area is a replacement storage area with a maximum health degree score in the replacement area.

First, when detecting, in the data storage area, a problematic storage block whose health degree is less than the threshold corresponding to the first-level replacement storage area, the storage device moves the problematic storage block into a second-level replacement storage area.

Then, the storage device obtains a replacement storage block from the first-level replacement storage area, and moves the replacement storage block into the data storage area.

Then, the storage device determines whether there is still a replacement storage block in the first-level replacement storage area, and continues to detect the data storage area if there is still the replacement storage block in the first-level replacement storage area.

If there is no replacement storage block in the first-level replacement storage area, the second-level replacement storage area is used as the current replacement area, the preset value is set to a threshold corresponding to the second-level replacement storage area, and the storage device continues to detect the data storage area. When there is no available storage block in the second-level replacement storage area, a third-level replacement storage area is used as the current replacement area, the preset value is set to a threshold corresponding to the third-level replacement storage area, and so on, till a storage block in a last-level replacement storage area in the replacement area is used up.

Case 3:

The data storage area, the replacement area, and the invalid area are obtained through pre-division. The replacement area includes a plurality of levels of replacement storage areas. There are a plurality of preset values that are specifically thresholds corresponding to the replacement storage areas at all levels, and a first-level replacement storage area is used as a replacement area in which replacement is first performed.

First, in a process in which the storage device detects the data storage area, if the storage device detects, in the data storage area, a problematic storage block whose health degree is less than a threshold corresponding to a last-level replacement storage area, the problematic storage block is moved into the invalid area.

If the storage device detects, in the data storage area, a problematic storage block whose health degree is less than a threshold of a non-last-level replacement storage area, the problematic storage block is moved into a next-level replacement storage area of the non-last-level replacement storage area. A replacement storage block is obtained from the first-level replacement storage area and moved into the data storage area.

Then the storage device determines whether there is still a replaceable replacement storage block in the first-level replacement storage area. If there is the replaceable replacement storage block in the first-level replacement storage area, the storage device continues to detect the data storage area. If there is no replaceable replacement storage block in the first-level replacement storage area, a second-level replacement storage area is used as a replacement area in which replacement is to be performed, and the storage device continues to detect the data storage area, and so on. The storage device moves a problematic storage block from the data storage area, and moves a qualified storage block from a corresponding replacement storage area into the data storage area.

It can be learned from the foregoing descriptions that when the replacement area includes a plurality of levels of replacement storage areas, in a process of obtaining a replacement storage block, if the current replacement storage area includes the replacement storage block, the storage device obtains the replacement storage block from the current replacement storage area, and determines, after obtaining the replacement storage block, whether there is still the replacement storage block in the current replacement storage area. If there is no replacement storage block in the current replacement storage area, a next-level replacement storage area is used as the current replacement storage area, so that when replacement is further required subsequently, a replacement storage block is directly obtained from a replacement storage area marked as the current replacement storage area. The storage device depends on a created index table in all the foregoing replacement processes, to rapidly find the replacement storage block.

Optionally, the storage device may not mark a replacement storage area in which replacement is currently performed. In a process of obtaining the replacement storage block, the storage device may sequentially search replacement storage areas from the beginning of the index table, to obtain an available replacement storage block.

Optionally, in a replacement process, the storage device may obtain replacement storage blocks that are of a same quantity as problematic storage blocks from the replacement storage area, and moves the replacement storage blocks into the data storage area. Certainly, the quantity of the replacement storage blocks may be less than or greater than the quantity of the problematic storage blocks. This may be flexibly determined based on a requirement in specific application.

In this embodiment of this application, the storage device obtains a plurality of levels of storage areas by performing pre-division in descending order of the health degrees of the storage blocks in the storage medium. A storage area with a highest health degree is used as the data storage area, a storage area with a lowest health degree is used as the invalid area, and a storage area with a remaining health degree is used as the replacement area. The storage device detects the data storage area, moves the problematic storage block from the data storage area after detecting the problematic storage block, obtains the replacement storage block from the replacement area, and moves the replacement storage block into the data storage area. In an entire process of managing the storage medium by the storage device, a capacity of the data storage area can be restored without reducing OP area of the storage device, thereby ensuring stability of the OP area in an entire life cycle of the storage device, and stabilizing a service life and performance of the storage device.

A case in which this application is applied to a storage device S whose storage medium is pre-divided is described below by way of example with reference to FIG. 7.

Figure 7:
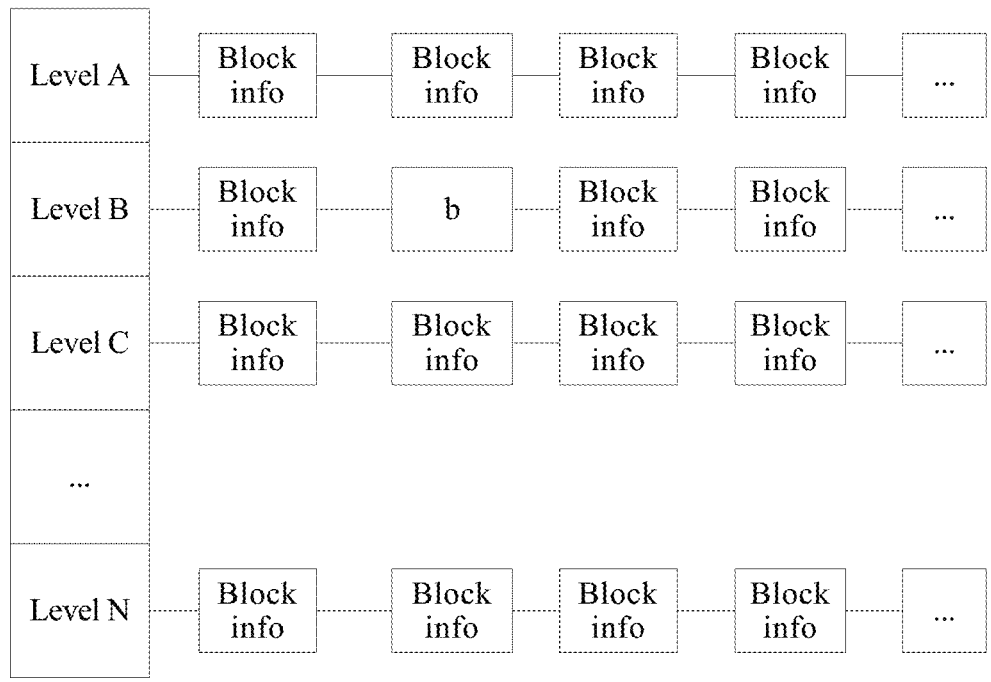
FIG. 7 is a schematic diagram of an index table according to an embodiment of this application.

As shown in FIG. 7, storage blocks in the storage medium in the storage device S are classified into areas in the manner disclosed in the foregoing embodiments of this application. A-level to N-level flash healthy block storage areas and a flash invalid block storage area are obtained in descending order of health degrees.

The A-level flash healthy block storage area is a data storage area, and is a storage area with a highest health degree. The A-level flash healthy block storage area is divided into a user-visible area A1 and OP area A2. B-level to the N-level flash healthy block storage areas are replacement storage areas whose health degrees are in descending order. The flash invalid block storage area is an invalid area. In addition, the B-level flash healthy block storage area is a current replacement storage area.

Figure 8:
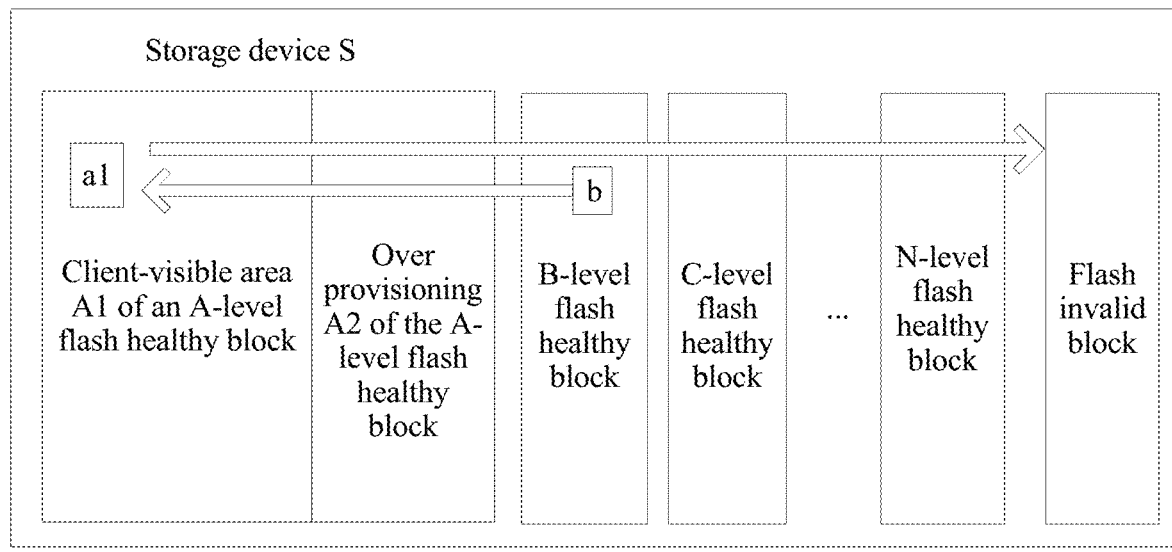
FIG. 8 is a schematic diagram of an application scenario in which a method for managing a storage medium is used according to an embodiment of this application.

Based on the foregoing division of the storage medium, the storage device creates an index table in FIG. 8 by using a tree structure. In a process of managing the storage medium by the storage device, each storage block (Block) in the index table dynamically changes as constant replacement between the data storage area and a replacement area.

A specific application scenario is as follows:

The storage device S detects the user-visible area A1 of the A-level flash healthy block storage area.

Figure 9:
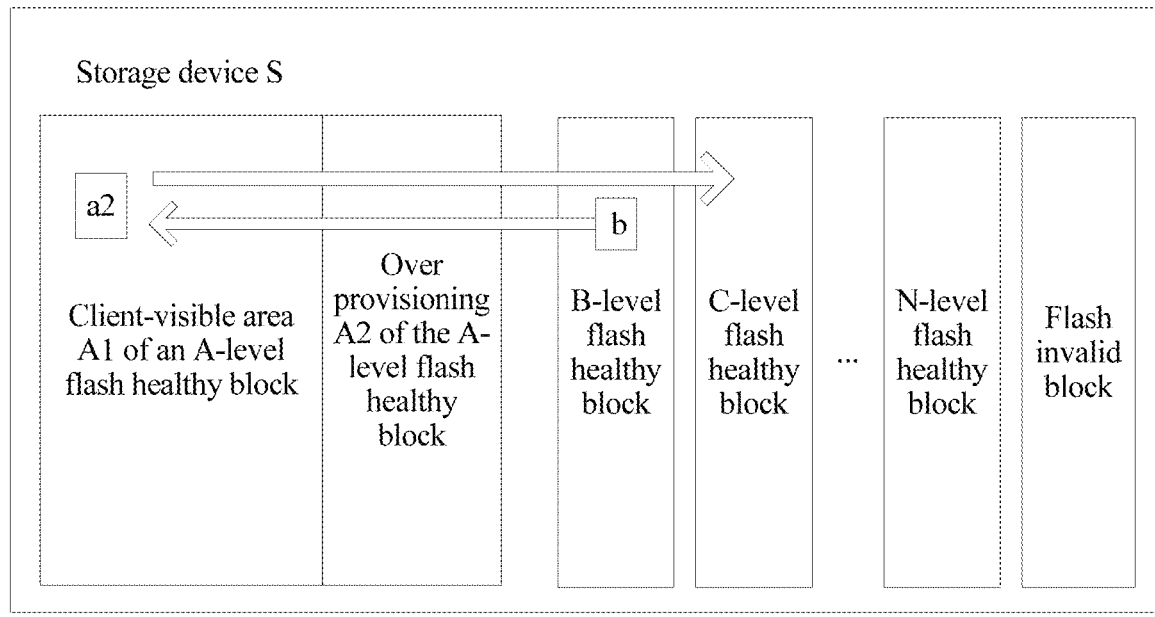
FIG. 9 is a schematic diagram of another application scenario in which a method for managing a storage medium is used according to an embodiment of this application.

In case 1, with reference to an arrow direction shown in FIG. 9, if the storage device S detects that there is a problematic storage block a1 in the user-visible area A1 of the A-level flash healthy block storage area, and a health degree of the problematic storage block a1 is less than a threshold corresponding to the N-level flash healthy block storage area, the problematic storage block a1 is a bad block, namely, an invalid storage block.

The storage device S moves the problematic storage block a1 from the user-visible area A1 into the flash invalid block storage area. It is found based on the index table shown in FIG. 8 that there is an unused storage block b in the B-level flash healthy block storage area, and the storage block b is moved into the user-visible area A1 of the level-A flash healthy block storage area.

Figure 10:
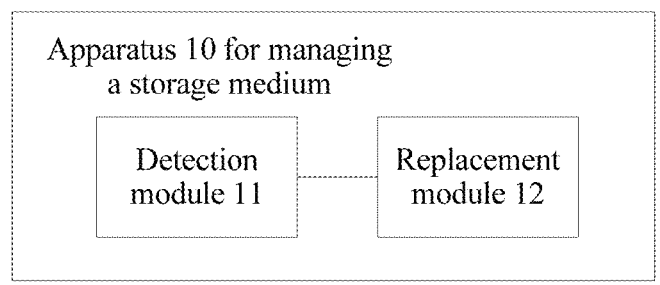
FIG. 10 is a schematic structural diagram of an apparatus for managing a storage medium according to an embodiment of this application.

In case a, with reference to an arrow direction shown in FIG. 10, if the storage device S detects that there is a problematic storage block a2 in the user-visible area A1 of the level-A flash healthy block storage area, and a health degree of the problematic storage block a2 is less than a threshold corresponding to the B-level flash healthy block storage area and is greater than a threshold corresponding to a C-level flash healthy block storage area, the problematic storage block a2 is used as a storage block with a low health degree and is moved into the C-level flash healthy block storage area. It is found based on the index table shown in FIG. 8 that there is an unused storage block b in the B-level flash healthy block storage area, and the storage block b is moved into the user-visible area A1 of the level-A flash healthy block storage area.

In this embodiment of this application, with reference to the specific application scenario, on a basis that the storage medium is pre-divided into a plurality of levels of storage areas, a storage block in a storage area with a relatively low health degree is replaced with a problematic storage block in a storage area with a highest health degree, thereby ensuring stability of the OP area in an entire life cycle of the storage device, and stabilizing a service life and performance of the storage device.

Based on the method for managing a storage medium in a storage device disclosed above, a corresponding embodiment of this application further discloses an apparatus for managing a storage medium to which the method is applied, and a storage device on which the apparatus for managing a storage medium is disposed. The storage medium is pre-divided into a data storage area and a replacement area based on health degrees of storage blocks. A health degree of a storage block in the data storage area is greater than a health degree of a storage block in the replacement area. The health degree is used to measure performance of a storage block in the storage medium.

Figure 11:
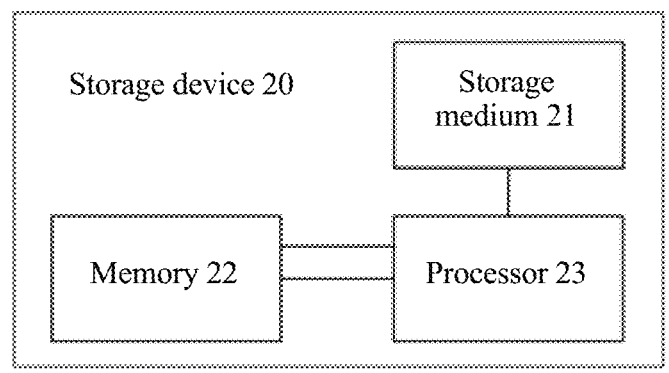
FIG. 11 is a schematic structural diagram of a storage device according to an embodiment of this application.

As shown in FIG. 11, the apparatus 10 for managing a storage medium includes a detection module 11 and a replacement module 12.

The detection module 11 is configured to detect whether there is a problematic storage block in the data storage area, where the problematic storage block is a storage block whose health degree is less than a preset value.

The replacement module 12 is configured to: when the problematic storage block is detected, move the problematic storage block from the data storage area, obtain a replacement storage block from the replacement area, and move the obtained replacement storage block into the data storage area.

The apparatus for managing a storage medium pre-divides the storage medium into the replacement area and an invalid area, and the replacement area includes a plurality of levels of replacement storage areas. The plurality of levels of replacement storage areas are sorted in descending order of health degrees of storage blocks in the storage areas. If the preset value used in the detection module 11 is a threshold corresponding to a current replacement storage area, the replacement module 12 includes:

a first moving unit, configured to move the problematic storage block from the data storage area into a next-level replacement storage area of the current replacement storage area;

a first obtaining unit, configured to obtain the replacement storage block from the current replacement storage area; and a marking unit, configured to: determine whether there is still the storage block in the current replacement storage area, and if there is no storage block in the current replacement storage area, use a next-level replacement storage area of the current replacement storage area as the current replacement storage area.

If the preset value used in the detection module 11 is a threshold corresponding to the invalid area, the first moving unit included in the replacement module 12 is configured to: when the problematic storage block is detected, move the problematic storage block from the data storage area into the invalid area.

Optionally, the apparatus for managing a storage medium disclosed in this application further includes:

a classification module, configured to: obtain at least one performance parameter of each storage block in the storage medium in the storage device; obtain a health degree score of each storage block in the storage medium based on the at least one performance parameter; sort the storage blocks in the storage medium in descending order of the health degree scores; determine a quantity m of to-be-selected storage blocks based on a sorting sequence of the storage blocks and formula (4); select first m storage blocks as a storage area with a highest health degree; and classify remaining storage blocks into the replacement area and the invalid area.

Optionally, the classification module may further classify storage blocks in the replacement area based on health degree scores of the storage blocks, to obtain a plurality of levels of replacement storage areas sorted in descending order of health degrees. Capacity sizes of the plurality of levels of replacement storage areas obtained by the storage device through classification may be the same or different. Optionally, the capacity sizes of the plurality of levels of replacement storage areas obtained by the storage device through classification may be the same as or may be different from an OP capacity of the storage medium. Optionally, the storage device may also use, as the invalid area, a storage area at a lowest health degree level in the plurality of levels of replacement storage areas sorted in descending order of the health degrees.

A calculation module that performs calculation for each storage block specifically includes:

a third obtaining unit, configured to obtain statistics data corresponding to i health degree statistics indicators of the storage block, where a value of i is greater than 1;

a first calculation unit, configured to calculate i pieces of statistics data to obtain health degree scores $Score_i$ of the i health degree statistics indicators;

a second calculation unit, configured to determine weights $W_i$ of the i health degree statistics indicators in an overall fuzzy evaluation system, where $0<W_i\leq 1$, and $\Sigma W_i=1$; and a third calculation unit, configured to obtain a health degree score Score of the storage block by using the i health degree scores $Score_i$ and the weights $W_i$.

The first calculating unit includes a zero-mean normalization calculation unit, configured to obtain the health degree scores $Score_i$ of the i health degree statistics indicators by using formula (1); or includes a linear normalization calculation unit, configured to obtain the health degree scores $Score_i$ of the i health degree statistics indicators by using formula (2).

The apparatus for managing a storage medium includes an index table, and the index table is used to record information about a storage block included in each partition of the storage medium.

Based on the foregoing apparatus for managing a storage medium disclosed in the embodiment of this application, the foregoing disclosed modules or units may be integrated into an entity storage device in actual application. As shown in FIG. 11, a storage device 20 includes a storage medium 21, a memory 22, and a processor 23.

A partition operation is performed on the storage medium 21 during a delivery test. The storage medium 21 is pre-divided into a data storage area and a replacement area based on health degrees of storage blocks. A health degree of a storage block in the data storage area is greater than a health degree of a storage block in the replacement area, and the health degree is used to measure performance of a storage block in the storage medium.

The memory 22 may include a high-speed RAM memory, and may also include a non-volatile memory, for example, at least one disk memory. The memory 22 stores an operating procedure for managing the storage medium 21.

The operating procedure for managing the storage medium 21 may include program code, and the program code may include a series of operating instructions sorted in specific order.

The processor 23 may be a central processing unit CPU, or a specific integrated circuit, or one or more integrated circuits configured to implement this embodiment of this application.

The processor 23 communicates with the memory 22, and when the storage medium 21 needs to be managed, the processor 23 invokes the operating procedure that is for managing the storage medium 21 and that is stored in the memory 22. For the operating procedure, refer to the method for managing a storage medium in a storage device according to the embodiment of this application, and details are not described herein.

In conclusion, in the technical solution for managing a storage medium in a storage device according to the foregoing embodiments of this application, the storage medium is pre-divided based on a health degree, to obtain a plurality of levels of storage areas. A storage area with a highest health degree is used as a data storage area, a storage area with a lowest health degree is used as an invalid area, and a remaining storage area is used as a replacement area. During use of the storage device, the storage device detects whether there is a problematic storage block in the data storage area, and when detecting the problematic storage block, moves the problematic storage block from the data storage area, obtains a replacement storage block from the replacement area, and moves the replacement storage block into the data storage area. In this way, the problematic storage block in the data storage area is replaced with the replacement storage area in the replacement area obtained through pre-division, thereby ensuring stability of OP area in an entire life cycle of the storage device, and stabilizing a service life and performance of the storage device.

The embodiments in this application are all described in a progressive manner, for same or similar parts in the embodiments, reference may be made to these embodiments, and each embodiment focuses on a difference from other embodiments. The apparatus disclosed in the embodiments is described relatively simply because it corresponds to the method disclosed in the embodiments, and for portions related to those of the method, refer to the description of the method. In combination with the embodiments disclosed in this specification, method or algorithm steps may be implemented by hardware, a software module executed by a processor, or a combination thereof. The software module may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

The embodiments disclosed above are described to enable a person skilled in the art to implement or use this application. Various modifications to the embodiments are obvious to the person skilled in the art.

What is claimed is:

1. A method for managing a storage medium in a storage device, comprising:
    obtaining respective health degree scores for a plurality of storage blocks in the storage medium, each health degree score measuring a performance of a corresponding storage block of the plurality of storage blocks, and each health degree score being in direct proportion to the performance of the corresponding storage block;
    detecting a problematic storage block in a data storage area of the storage medium, the problematic storage block having a health degree score less than a preset value; and
    replacing, in response to the problematic storage block being detected, the problematic storage block with a replacement storage block from a replacement storage area of the storage medium, a first health degree score of a first storage block in the data storage area being greater than a second health degree score of a second storage block in the replacement storage area.

2. The method according to claim 1, wherein:
    the replacement storage area comprises at least two levels of replacement storage areas;
    the at least two levels of replacement storage areas are sorted in descending order based on relative health degree scores of storage blocks in the replacement storage area; and
    the method further comprising:
        selecting the replacement storage block according to the descending order of the at least two levels of replacement storage areas.

3. The method according to claim 2, wherein:
    the preset value corresponds to a current level of the at least two levels of replacement storage areas from which the replacement storage block is currently selected; and
    replacing the problematic storage block with the replacement storage block comprises:
        moving the problematic storage block from the data storage area to another level of the at least two levels of replacement storage areas following the current level of the at least two levels of replacement storage areas in the descending order.

4. The method according to claim 1, wherein:
    the storage medium further comprises an invalid storage area;
    the preset value corresponds to the invalid storage area; and
    replacing the problematic storage block with the replacement storage block comprises:
        moving the problematic storage block from the data storage area to the invalid storage area.

5. The method according to claim 1, further comprising:
    obtaining at least one performance parameter of each storage block of the plurality of storage blocks in the storage medium;
    obtaining a health degree score of each storage block of the plurality of storage blocks in the storage medium based on the at least one performance parameter;
    sorting the plurality of storage blocks in the storage medium in descending order of the health degree scores;
    selecting, based on a sorting sequence of the plurality of storage blocks, first m storage blocks of the plurality of storage blocks for the data storage area, wherein m=(Capacityuser+Capacityop)/Sizeblock, wherein Capacityop is a first size of over provisioning area of the storage device, Capacityuser is a second size of a user-visible storage area of the storage device, and Sizeblock is a third size of a third storage block; and
    obtaining the replacement storage area from remaining storage blocks of the plurality of storage blocks in the storage medium through classification.

6. The method according to claim 1, further comprising:
    recording, in an index table of the storage device, information about a third storage block included in a storage area of the storage medium.

7. The method according to claim 1, further comprising:
    sorting, according to the health degree scores, the plurality of storage blocks into a sorting sequence; and
    assigning, according to the sorting sequence, each storage block of the plurality of storage blocks to a corresponding storage area of a plurality of storage areas of the storage medium, the plurality of storage areas comprising the data storage area and the replacement storage area.

8. The method according to claim 7, wherein:
    obtaining the respective health degree scores for the plurality of storage blocks in the storage medium comprises:
        obtaining at least one performance parameter of each storage block of the plurality of storage blocks in the storage medium; and
        obtaining a health degree score of each storage block of the plurality of storage blocks in the storage medium based on the at least one performance parameter;
    sorting the plurality of storage blocks comprises:
        sorting the plurality of storage blocks in the storage medium in descending order of the health degree scores; and
    assigning each storage block of the plurality of storage blocks comprises:
        selecting, based on the sorting sequence of the plurality of storage blocks, first m storage blocks of the plurality of storage blocks for the data storage area, wherein m=(Capacityuser+Capacityop)/Sizeblock, wherein Capacityop is a first size of over provisioning area of the storage device, Capacityuser is a second size of a user-visible storage area of the storage device, and Sizeblock is a third size of a third storage block; and
        selecting remaining storage blocks of the plurality of storage blocks for the replacement storage area in the storage medium.

9. A storage device, comprising:
    a non-transient memory storing instructions; and
    a processor coupled to the non-transient memory to execute the instructions to:
        obtain respective health degree scores for a plurality of storage blocks in a storage medium, each health degree score measuring a performance of a corresponding storage block of the plurality of storage blocks, and each health degree score being in direct proportion to the performance of the corresponding storage block;

detect a problematic storage block in a data storage area of the storage medium, wherein the problematic storage block has a health degree score less than a preset value; and replace, in response to the problematic storage block being detected, the problematic storage block with a replacement storage block from a replacement storage area of the storage medium, wherein a first health degree score of a first storage block in the data storage area is greater than a second health degree score of a second storage block in the replacement storage area.

10. The storage device according to claim 9, wherein:
the replacement storage area comprises at least two levels of replacement storage areas;
the at least two levels of replacement storage areas are sorted in descending order based on relative health degree scores of storage blocks in the replacement storage area; and
the processor executes further instructions to select the replacement storage block according to the descending order of the at least two levels of replacement storage areas.

11. The storage device according to claim 10, wherein:
the preset value corresponds to a current level of the at least two levels of replacement storage areas from which the replacement storage block is currently selected; and
the instructions to replace the problematic storage block with the replacement storage block comprise further instructions to:
move the problematic storage block from the data storage area to another level of the at least two levels of replacement storage areas following the current level of the at least two levels of replacement storage areas in the descending order.

12. The storage device according to claim 9, wherein:
the storage medium further comprises an invalid storage area;
the preset value corresponds to the invalid storage area; and
the instructions to replace the problematic storage block with the replacement storage block comprise further instructions to:
move the problematic storage block from the data storage area to the invalid storage area.

13. The storage device according to claim 9, wherein the processor executes further instructions to:
obtain at least one performance parameter of each storage block of the plurality of storage blocks in the storage medium;
obtain a health degree score of each storage block of the plurality of storage blocks in the storage medium based on the at least one performance parameter;

sort the plurality of storage blocks in the storage medium in descending order of the health degree scores;
select, based on a sorting sequence of the plurality of storage blocks, first m storage blocks of the plurality of storage blocks for the data storage area, wherein m=(Capacityuser+Capacityop)/Sizeblock, wherein Capacityop is a first size of over provisioning area of the storage device, Capacityuser is a second size of a user-visible storage area of the storage device, and Sizeblock is a third size of a third storage block; and
obtain the replacement storage area from remaining storage blocks of the plurality of storage blocks in the storage medium through classification.

14. The storage device according to claim 9, wherein the storage device comprises an index table, and the index table records information about a third storage block included in a storage area of the storage medium.

15. The storage device according to claim 9, wherein the processor executes further instructions to:
sort, according to the health degree scores, the plurality of storage blocks into a sorting sequence; and
assign, according to the sorting sequence, each storage block of the plurality of storage blocks to a corresponding storage area of a plurality of storage areas of the storage medium, the plurality of storage areas comprising the data storage area and the replacement storage area.

16. The storage device according to claim 15, wherein:
the instructions to obtain the respective health degree scores for the plurality of storage blocks in the storage medium comprises further instructions to:
obtain at least one performance parameter of each storage block of the plurality of storage blocks in the storage medium; and
obtain a health degree score of each storage block of the plurality of storage blocks in the storage medium based on the at least one performance parameter;
the instructions to sort the plurality of storage blocks comprises further instructions to:
sort the plurality of storage blocks in the storage medium in descending order of the health degree scores; and
the instructions to assign each storage block of the plurality of storage blocks comprises:
select, based on the sorting sequence of the plurality of storage blocks, first m storage blocks of the plurality of storage blocks for the data storage area, wherein m=(Capacityuser+Capacityop)/Sizeblock, wherein Capacityop is a first size of over provisioning area of the storage device, Capacityuser is a second size of a user-visible storage area of the storage device, and Sizeblock is a third size of a third storage block; and
select remaining storage blocks of the plurality of storage blocks for the replacement storage area in the storage medium.

* * * * *